United States Patent
Li et al.

(10) Patent No.: US 10,742,236 B2
(45) Date of Patent: Aug. 11, 2020

(54) METHODS, SYSTEMS AND COMPUTER-READABLE MEDIA FOR DECODING CYCLIC CODE

(71) Applicant: CHONGQING UNIVERSITY OF POSTS AND TELECOMMUNICATIONS, Chongqing (CN)

(72) Inventors: Yong Li, Chongqing (CN); Hsin-Chiu Chang, Kaohsiung (CN); Hongqing Liu, Chongqing (CN); Trieu-Kien Truong, Kaohsiung (CN)

(73) Assignee: CHONGQING UNIVERSITY OF POSTS AND TELECOMMUNICATIONS, Chongqing (CN)

( * ) Notice: Subject to any disclaimer, the term of this patent is extended or adjusted under 35 U.S.C. 154(b) by 193 days.

(21) Appl. No.: 15/772,067

(22) PCT Filed: Nov. 2, 2016

(86) PCT No.: PCT/CN2016/104395
§ 371 (c)(1),
(2) Date: Apr. 29, 2018

(87) PCT Pub. No.: WO2017/076301
PCT Pub. Date: May 11, 2017

(65) Prior Publication Data
US 2018/0323805 A1    Nov. 8, 2018

Related U.S. Application Data

(63) Continuation-in-part of application No. PCT/CN2015/093592, filed on Nov. 2, 2015.

(51) Int. Cl.
*H03M 13/15* (2006.01)
*H03M 13/00* (2006.01)
(Continued)

(52) U.S. Cl.
CPC ....... *H03M 13/1525* (2013.01); *H03M 13/15* (2013.01); *H03M 13/151* (2013.01);
(Continued)

(58) Field of Classification Search
None
See application file for complete search history.

(56) References Cited

U.S. PATENT DOCUMENTS 8,127,209 B1 * 2/2012 Zhang ................ H03M 13/1128
714/780
2002/0046382 A1 * 4/2002 Yang ..................... H03M 13/03
714/758
(Continued)

FOREIGN PATENT DOCUMENTS

| CN | 101753147 A | 6/2010 |
|---|---|---|
| TW | 201029339 A1 | 8/2010 |
| TW | 201044796 A | 12/2010 |

OTHER PUBLICATIONS

Lee, Hung-Peng et al, Improvement on Decoding of the (71,36,11) Quadratic Residue Code, The 6th International Conference on Computer Science&Education (ICCSE) Aug. 5, 2011 (Aug. 5, 2011), pp. 324-329.
(Continued)

*Primary Examiner* — Justin R Knapp
(74) *Attorney, Agent, or Firm* — Metis IP LLC

(57) ABSTRACT

A method for decoding a (n, k, d) cyclic code is disclosed. The method includes: receiving a word corresponding to the cyclic code; constructing a look-up table, wherein the look-up table includes k syndrome vectors and k error patterns; computing a syndrome vector of the received word by a hardware processor; comparing the weight of the syndrome vector of the received word with an error-correcting capacity; decoding the received word by adding the received word and the syndrome vector if the weight of the syndrome
(Continued)

vector of the received word is not more than the error-correcting capacity; decoding the received word by inverting bits in the message section in sequence and re-compute a syndrome vector of the inverted received word if the weight of the syndrome vector of the received word is more than the error-correcting capacity.

20 Claims, 13 Drawing Sheets

(51) Int. Cl.
*H03M 13/37* (2006.01)
*H03M 13/45* (2006.01)

(52) U.S. Cl.
CPC ....... *H03M 13/154* (2013.01); *H03M 13/159* (2013.01); *H03M 13/1545* (2013.01); *H03M 13/1575* (2013.01); *H03M 13/3746* (2013.01); *H03M 13/455* (2013.01); *H03M 13/1515* (2013.01)

(56) References Cited

U.S. PATENT DOCUMENTS

| | | |
|---|---|---|
| 2010/0031120 A1 | 2/2010 | Belogolovy et al. |
| 2011/0276862 A1 | 11/2011 | Truong et al. |
| 2013/0159819 A1 | 6/2013 | Jiang et al. |

OTHER PUBLICATIONS

H.C. Chang et al. A Weight Method of Decoding the (23,12,7) Golay Code Using Reduced Table Lookup, Communications, Circuits and Systems, 2008. ICCCAS 2008. International Conference on Oct. 24, 2008, 5 pages.
International Search Report for PCT/CN2016/104395 dated Jan. 25, 2017, 4 pages.
Written Opinion of the International Searching Authority for PCT/CN2016/104395 dated Jan. 25, 2017, 4 pages.
International Search Report in PCT/CN2015/093592 dated Jul. 26, 2016, 4 pages.
Written Opinion of the International Searching Authority for PCT/CN2015/093592 dated Jul. 26, 2016, 4 pages.
Yunde Duan et al., An Improved Decoding Algorithm to Decode Quadratic Residue Codes Based on the Difference of Syndromes, IEEE Transactions on Information Theory, 2020, 6 pages.

* cited by examiner

METHODS, SYSTEMS AND COMPUTER-READABLE MEDIA FOR DECODING CYCLIC CODE

CROSS-REFERENCE TO RELATED APPLICATIONS

This application is a U.S. national stage application under 35 U.S.C. § 371 of International Application No. PCT/CN2016/104395, filed on Nov. 2, 2016, designating the United States of America, which in turn is a continuation-in-part and claims priority of PCT Application No. PCT/CN2015/093592 filed on Nov. 2, 2015, the entire contents of which are incorporated herein by reference.

TECHNICAL FIELD

The present disclosure relates to methods, systems, and computer-readable media for decoding a cyclic code. More particularly, the present disclosure relates to decoding a cyclic code and performing error correction on the cyclic code based on syndromes of the cyclic code.

BACKGROUND

In today's digital era, a wide variety of signals—such as video and audio signals—are digitalized. A few examples of products that use digital signals include digital TV, Bluetooth headphones, DVD players, WAP mobile phone handsets, etc. To ensure that the signals used in digital products may be read properly, enabling the products to present high-definition video and audio even when the signals have been transmitted over long distances, the signals are typically encoded and decoded. However, since transmission media and channels are easily corrupted by interference during data access and transmission, error detection and correction become more and more significant. Generally, error-correcting codes are widely used for enhancing reliability of data access and transmission. In the error-correcting codes, application of a cyclic code is not uncommon.

A finite field (also known as a Galois field) is a field composed of a finite number of elements. The number of elements in the field called the order or cardinality of the field. This number is always of the form $p^m$, where p is a prime number and m is a positive integer. A Galois field of order $q=p^m$ will be designated either as GF ($p^m$) or as Fq in the following. These symbols GF ($p^m$) and Fq are fully synonymous. A polynomial over an arbitrary field (including a finite field) will be designated as p(x), or a similar symbol. A element in which the polynomial is to be evaluated will be designated by lower-case Greek letters such as $\alpha$, $\beta$ or $\gamma$, in the following. The definitions and properties of finite fields are described in many standard textbooks of mathematics, and reference is made to such standard textbooks for details.

In conventional cases, the error correction method of a cyclic code involves the use of an algebraic decoding method to eliminate syndromes from among the Newton's identities so as to obtain the error polynomial coefficient, which in turn may be used to obtain the error polynomial. However, with the increasingly higher requirements of communication in post-Internet era, the length and the kinds of cyclic codes increases, it becomes increasingly difficult for the high order equations produced when using an algebraic method to find a solution over a Galois field, making it difficult to obtain the error polynomial.

To solve the problems discussed above, which typically arises in the realm of computer networks and post-Internet era communication need, the present disclosure provides an error correction system applicable to all cyclic codes.

SUMMARY

In some embodiments, a system for decoding a cyclic code is disclosed. The system may comprise at least one storage medium including a set of instructions for decoding a (n, k, d) cyclic code including a message section and a parity check section; at least one processor configured to communicate with the at least one storage medium, wherein when executing the set of instructions, the at least one processor is directed to: receive a word corresponding to the (n, k, d) cyclic code; construct a look-up table, wherein the look-up table includes k syndrome vectors and k error patterns; compute a syndrome vector of the received word by a hardware processor; determine a weight of the syndrome vector of the received word; determine whether the weight of the syndrome vector of the received word is more than the error-correcting capacity; decode the received word by adding the received word and the syndrome vector when the weight of the syndrome vector of the received word is not more than the error-correcting capacity; and decode the received word by inverting bits in the message section in sequence and re-computing a syndrome vector of the inverted received word when the weight of the syndrome vector of the received word is more than the error-correcting capacity.

In some embodiments, when the weight of the syndrome vector of the received word is not more than the error-correcting capacity, the at least one processor is further directed to: generate a decoded word; determine whether the received word has been shifted to left by k bits; shift the decoded word to right by k bits when the received word has been shifted to left by k bits; and output the decoded word.

In some embodiments, when the weight of the syndrome vector of the received word is more than the error-correcting capacity, the at least one processor is further directed to: determine a weight of the syndrome vector of the inverted received word; compare the weight of the syndrome vector of the inverted received word with a difference between the error-correcting capacity with the number of the inverted bits; generate a decoded word according to $I_c = r + \sum_{i=0}^{w_e-1} e_{m,l_i} + s_{invert}$, wherein r is the received word, $w_e$ is number of errors occurred in the message section of the received word, $e_{m,l_i}$ is an error pattern, an error location of which is the location of the inverted bit and $s_{invert}$ is the syndrome vector of the inverted received word and padding zeros in locations according to the message section of the inverted received word.

In some embodiments, the at least one processor is further directed to: determine that the received word is cyclically shifted to the left by k bits; shift cyclically the decoded word to the right by k bits; and output the decoded word.

In some embodiments, the processor is further directed to: shift the received word to the left by k bits cyclically if number of errors occurred in the message section of the received word is more than [t/2], wherein the t is the error-correcting capacity; re-compute syndrome vector of the cyclically shifted received word; and decode the cyclically shifted received word iteratively.

In some embodiments, the processor is further directed to: determine whether the cyclically shifted received word is decoded successfully; invert the (k−1)th bit of the cyclically shifted received word to update the cyclically shifted received word; and decode the cyclically shifted received word iteratively.

In some embodiments, a method for decoding a (n, k, d) cyclic code including a message section and a parity check section is disclosed. The method may comprise constructing a look-up table, wherein the look-up table includes k syndrome vectors and k error patterns; computing a syndrome vector of a received word corresponding to the (n, k, d) cyclic code by a hardware processor; determining a weight of the syndrome vector of the received word; determining whether the weight of the syndrome vector of the received word is more than the error-correcting capacity; decoding, using a processor, the received word by adding the received word and the syndrome vector when the weight of the syndrome vector of the received word is not more than the error-correcting capacity; and decoding, using a processor, the received word by inverting bits in the message section in sequence and re-computing a syndrome vector of the inverted received word when the weight of the syndrome vector of the received word is more than the error-correcting capacity.

In some embodiments, the method may further comprise padding the syndrome vector of the received word with zeros in locations according to the message section of the received word.

In some embodiments, when decoding the received word by adding the received word and the syndrome vector, the method may further comprise generating a decoded word; determining whether the received word has been shifted to left by k bits; shifting the decoded word to right by k bits when the received word has been shifted to left by k bits; and outputting the decoded word.

In some embodiments, when decoding the received word by inverting bits in the message section in sequence and re-computing the syndrome vector of the inverted received word, the method may further comprise determining a weight of the syndrome vector of the inverted received word; comparing the weight of the syndrome vector of the inverted received word with a difference between the error-correcting capacity with the number of the inverted bits; generating a decoded word according to $I_c = r + \Sigma_{i=0}^{w_e-1} e_{m,l_i} + s_{invert}$, wherein r is the received word, $w_e$ is number of errors occurred in the message section of the received word, $e_{m,l_i}$ is an error pattern, an error location of which is the location of the inverted bit and $s_{invert}$ is the syndrome vector of the inverted received word and padded zeros in locations according to the message section of the inverted received word.

In some embodiments, the method may further comprise determining that the received word is cyclically shifted to the left by k bits; shifting cyclically the decoded word to the right by k bits; and outputting the decoded word.

In some embodiments, the method may further comprise shifting the received word to the left by k bits cyclically if number of errors occurred in the message section of the received word is more than $\lfloor t/2 \rfloor$, wherein the t is the error-correcting capacity; re-computing syndrome vector of the cyclically shifted received word; and decoding the cyclically shifted received word iteratively.

In some embodiments, determining whether the cyclically shifted received word is decoded successfully; determining whether the cyclically shifted received word is decoded successfully; inverting the (k−1)th bit of the cyclically shifted received word to update the cyclically shifted received word; and decoding the cyclically shifted received word iteratively.

BRIEF DESCRIPTION OF THE DRAWINGS

The accompanying drawings, which are incorporated in and constitute a part of this specification, illustrate several embodiments of the disclosure and together with the description, serve to explain the principles of the disclosure. In the drawings.

DETAILED DESCRIPTION OF THE DISCLOSURE

The exemplary embodiments of the present disclosure have been disclosed in the description and examples. However the examples should not be construed as a limitation to the actual applicable scope of the disclosure, and as such, all modifications and alterations without departing from the spirits of the disclosure and appended claims shall remain within the protected scope and claims of the disclosure.

In accordance with various implementations, the present disclosure provides mechanisms (which may include systems, and media) for decoding a cyclic code. The mechanisms may decode and/or correct a cyclic code (e.g., a Quadratic Residue (QR) code) based on a table look-up decoding algorithm. For example, the mechanisms may correct one or more errors occurred in the cyclic code based on a table, which may be constructed by one or more syndromes and/or one or more error patterns. More particularly, for example, the mechanisms may search the error patterns occurred in the message section of the cyclic code and the corresponding syndrome vectors. The mechanisms may then decode and/or correct the cyclic code based on the searched error patterns and syndrome vectors.

As another example, one or more errors occurred in the cyclic code may be corrected by performing a first bit inversions on the cyclic code. More particularly, for example, the first bit of the cyclic code may be inverted to generate an inverted received code. The first bit may be selected based on reliability associated with the first bit. After the inversion of the first bit, the mechanisms may compute the syndrome vector of the inverted received word. If the weight of the syndrome vector of the inverted received word does not satisfy one or more conditions, the mechanism may flip back the first bit and inverted a second bit and compute the syndrome vector again. For example, the conditions may be that the weight may be smaller than or equal to the number that the error capability minus number of errors occurred in message section of the cyclic code. In some embodiments, the first bit and the second bit may be associated with a first reliability score and a second reliability score, respectively. In some embodiments, the first reliability score is lower than the second reliability score. In some embodiments, the bits of the cyclic code may be sorted in descending order or ascending order. In some embodiments, the first bit and the second bit may be continuous in the cyclic code. In some embodiments, multiple inversions may be performed on the cyclic code bit-by-bit until a predetermined threshold number of inversions have been performed on the cyclic code.

Figure 1A:
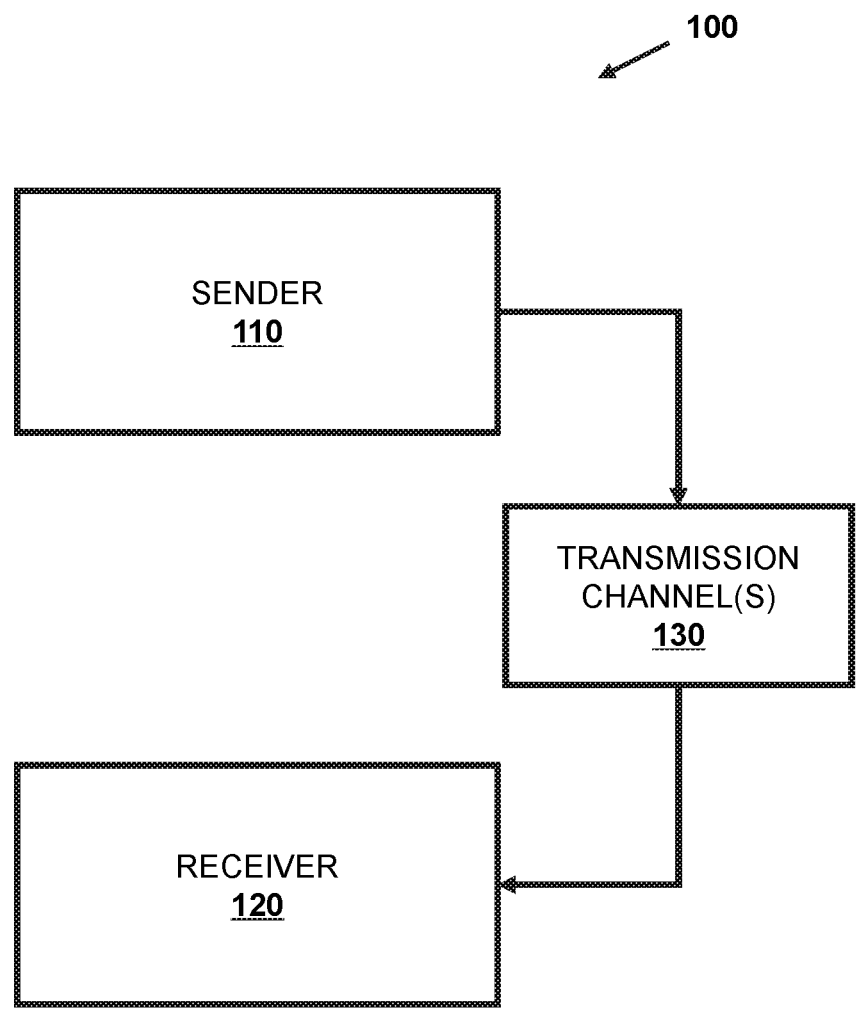
FIG. 1A illustrates a block diagram of an exemplary system according to some embodiments of the present disclosure.

FIG. 1A illustrates a block diagram of a system 100 in accordance with some embodiments of the present disclosure. As shown, system 100 may include a sender 110 to generate and send a codeword, a receiver 120 configured to receive and decode a received word corresponding to the cyclic code, a transmission channel 130 configured to deliver the codeword from the sender 110 to the receiver 120, and/or any other component for error correction and detection.

Figure 1B:
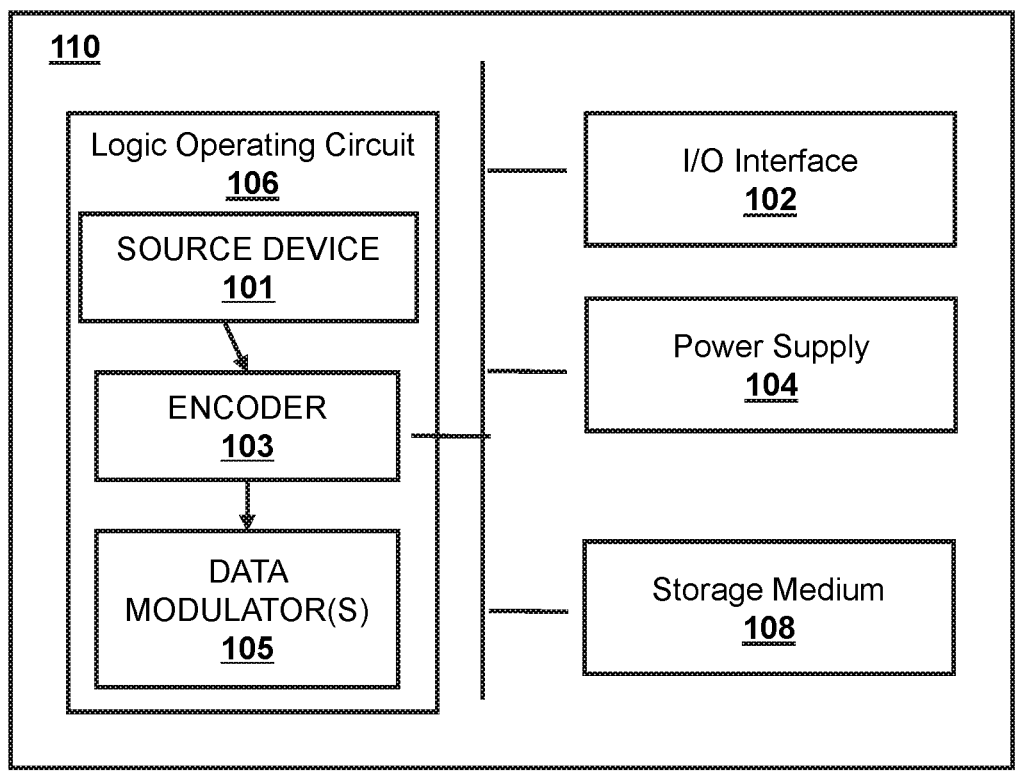
FIG. 1B illustrates a block diagram of an exemplary sender of the system according to some embodiments of the present disclosure.

FIG. 1B illustrates a block diagram of an example of sender 110 in accordance with some embodiments of the present disclosure. The sender 110 may be an electronic device such as a QR code generator and/or a mobile phone implementing a QR code generating application. For example, sender 110 may include an I/O interface 102, a power supply 104, a logic operating circuit 106, a storage medium 108, and/or any other component for generating and sending signals.

The power supply 104 may be configured to provide electrical power to sender 110. In some embodiments, the I/O interface 102 may be configured to receive external signals and/or instructions. For example, the I/O interface 102 may include an input device such as a sensor and/or an antenna to receive external signal and/or a physical or virtual key board to receive external instruction from a user. In some embodiments, the I/O interface 102 may be configured to send signals to another modules or terminals. For example, the I/O interface 102 may include an output device such as a display, an antenna, and/or other type of electronic output port.

In some embodiments, the storage medium 108 may be configured to store applications or sets of instructions for receiving and generating the cyclic code. For example, the storage medium 108 may be a non-transitory storage medium such as a hard disk, or a transitory storage medium such as RAM. The RAM may include a dynamic RAM (DRAM), a double date rate synchronous dynamic RAM (DDR SDRAM), a static RAM (SRAM), a thermistor RAM (T-RAM), and a zero-capacitor RAM (Z-RAM), etc.

In some embodiments, the logic operating circuit 106 may receive the signals and/or instructions from the I/O interface 102. Further, the logic operating circuit 106 may execute the set of instructions and/or applications in the storage medium 108 to generate the codeword. The logic operating circuit 106 may instruct the I/O interface 102 to output the codeword. The logic operating circuit 106 may be a processor and/or processing unit that includes hardware electronic circuits including, e.g., a source device 101, an encoder 103, a data modulator 105, and/or any other component for processing and sending signals.

In some embodiments, the source device(s) 101 may be a sequence signal generator, a pulse signal generator, a function generator, a binary signal generator, or the like, or any combination thereof. Source device(s) 101 may generate one or more messages, for example, binary information, training sequence, pseudorandom sequence, or the like, or any combination thereof.

In some embodiments, source device(s) 101 may generate a message (also referred to herein as the "original message"). Source device(s) 101 may transmit the original message to encoder 103 for further processing. For example, the original message may be expressed in an original message polynomial (e.g., a polynomial corresponding to the original message):

$$M(x)=\Sigma_{i=0}^{k-1} m_i x^i \tag{1}$$

Wherein k is the number of bits in message section of the cyclic code, $m_i$ is bit value corresponding to the location i of the message section of the cyclic code.

For another example, the original message may also be expressed in equation (2):

$$m=(m_0, m_1, m_2, \ldots, m_{k-1}) \tag{2}$$

In equation (2), m may be a binary sequence including k bits.

Upon receiving the original message, encoder 103 may encode the original message to generate an encoded message. For example, the original message may be encoded using a generator matrix and/or a shifting register. A cyclic code of the original message may be expressed as a code of (n, k, d), wherein n represents a length of the cyclic code, k represents a length of the original message, and d represents a Hamming distance of the cyclic code. Further, the codeword may be written as a codeword vector:

$$c=(c_0, c_1, c_2, \ldots, c_{n-1}) \tag{3}$$

In equation (3), c may be a binary sequence including n bits and include a message section ($c_0, c_1, c_2, \ldots, c_{k-1}$) and a parity check section ($c_k, c_{k+1}, c_{k+2}, \ldots, c_{n-1}$).

In some embodiments, components $c_0$ to $c_{n-1}$ can be computed based upon:

$$c_j = M(\alpha^j) \text{ for } 0 \le j \le n-1 \tag{4}$$

In equation (4), a is an $n^{th}$ root of unity in a finite field, i.e., Galois Field $GH(2^m)$.

More particularly, the source device(s) 101 may generate a message vector m consisting of information and zeros, that is to say:

$$m=(m_0, m_1, m_2, \ldots, m_{k-1}, m_k, m_{k+1} \ldots, m_{n-1}) \tag{5}$$

Where $m_0$ to $m_{k-1}$ are assigned to be information symbols, and $m_k$ to $m_{n-1}$ are assigned to be syndrome symbols and are assumed to be zero.

The components $c_j$ of the codeword c can be computed based upon the message vector m over the finite filed $GH(2^m)$ as follows:

$$c_j = \Sigma_{i=0}^{n-1} \cdot \alpha^{-ij} = M(\alpha^{-j}) \tag{6}$$

Data modulator(s) 105 may receive the codeword encoded by the encoder 103 and may then determine a transmitted waveform based on the codeword. The data modulator(s) 105 may modulate the codeword to generate a modulated signal for transmission. In some embodiments, the modulated signal may be generated based on one or more amplitude modulation schemes, frequency modulation schemes, phase modulation schemes, and/or any other suitable modulation scheme. Examples of the modulation schemes include amplitude-shift keying (ASK), frequency-shift keying (FSK), phase-shift keying (PSK) (e.g., quadrature phase-shift keying (QPSK), offset-QPSK, etc.), etc.

Figure 1C:
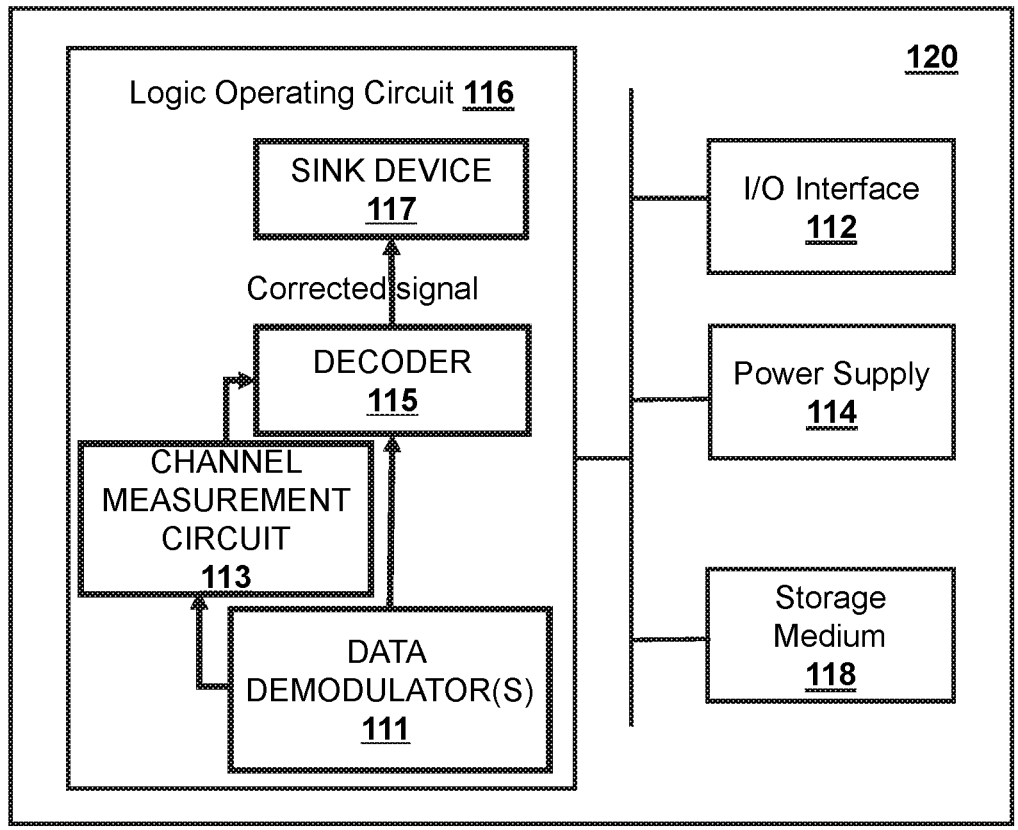
FIG. 1C illustrates a block diagram of an exemplary receiver of the system according to some embodiments of the present disclosure.

The modulated signal may be transmitted through the transmission channels(s) 130 and may be received by receiver 120. FIG. 1C illustrates a block diagram of an example of receiver 120 in accordance with some embodiments of the present disclosure. Receiver 120 may be an electronic device such as a mobile phone implementing QR code decoding applications. For example, receiver 120 may include an I/O interface 112, a power supply 114, a logic operating circuit 116, a storage medium 118, and/or any other components for receiving and processing signals.

The power supply 114 may be configured to provide electrical power to receiver 120. In some embodiments, the I/O interface 112 may be configured to receive external signals and/or instructions. For example, the I/O interface 112 may include an input device such as a sensor and/or an antenna to receive external signal and/or a physical or virtual key board to receive external instruction from a user. In some embodiments, the I/O interface 112 may be configured to send signals to another modules. For example, the I/O interface 112 may include an output device such as a display, an antenna, and/or other type of electronic output port.

In some embodiments, the storage medium 118 may be configured to store applications or sets of instructions for receiving and generating the codeword. For example, the storage medium 118 may be a non-transitory storage medium such as a hard disk, or a transitory storage medium such as RAM. The RAM may include a dynamic RAM (DRAM), a double data rate synchronous dynamic RAM (DDR SDRAM), a static RAM (SRAM), a thermistor RAM (T-RAM), and a zero-capacitor RAM (Z-RAM), etc.

In some embodiments, the logic operating circuit 116 may receive a word corresponding to the codeword and/or instructions from the I/O interface 112. The logic operating circuit 116 may execute the set of instructions and/or applications in the storage medium 118 to decode the received word and instruct the I/O interface 112 to output the decoded word. The logic operating circuit 116 may be a processor and/or processing unit that includes hardware electronic circuits, including, e.g., a data demodulator 111, a channel measurement circuit 113, a decoder 115, a sink device 117, and/or any other component for receiving and processing signals.

In some embodiments, the modulated signal may be transmitted through transmission channel(s) 130 and may be received by data demodulator (s) 111. In some embodiments, the transmission channel(s) 130 may be a wireless channel, for example, a channel with memory, a channel without memory, a constant channel, a variable-parameters channel, a single-user channel, a multiple-user channel, a noisy channel, a noiseless channel, a fading channel, or the like, or any combination thereof. In some embodiments, the transmission channel(s) 130 may also be a Rayleigh fading channel, a Rice channel, or a Gaussian channel. In some embodiments, the transmission channel(s) 130 may be a wired channel, for example, an open wire, a Symmetrical cable, coaxial cable, an Optical fiber, or the like, or any combination thereof.

Upon receiving the transmitted signal, data demodulator (s) 111 may demodulate the transmitted signal to generate a demodulated signal. For example, the demodulation may be a reverse process (relative to the modulation performed by the data modulator(s) 105) to recover the codeword. The demodulated signal may include the received word corresponding to the codeword. For example, errors may be introduced into the transmitted codeword by interference during transmission through the transmission channel(s) 130. The interference during the transmission channel 130 may include Doppler shift, noise, channel fading, echo interference, serial interference, inter-symbol interference, inter-channel interference, the like, or any combination thereof. The error may occur at any position of the received word. When one or more errors occurred, an error pattern may appear in the received word. In some embodiments, the error pattern may be represented as an error polynomial:

$$e(x)=\Sigma_{j=1}^{n-1}=e_j x^j=e_0+e_1 x+\ldots+e_{n-1} x^{n-1} \quad (7)$$

In equation (7), $e_j$ is the jth error correction value.

The error pattern may also be expressed in following equation:

$$e=(e_0, e_1, e_2, \ldots, e_{n-1}) \quad (8)$$

In some embodiments, e shown in equation (8) may be a binary sequence including n bits.

In some embodiments, an error pattern may be correctable if its weight is less than or equal to an error-correcting capacity. For example, for a (n, k, d) QR code, the error-correcting capacity may be computed as $\lfloor(d-1)/2\rfloor$, wherein $\lfloor x \rfloor$ denotes the greatest integer less than or equal to x. More particularly, for a (71, 36, 11) QR code, the error-correcting capacity may be 5.

In some embodiments, the received word may correspond to a combination of the error pattern and the codeword. For example, the received word may be determined based on the following equation:

$$r(x)=\Sigma_{j=0}^{n-1} r_j x^j=c(x)+e(x)=r_0+r_1 x+\ldots+r_{n-1} x^{n-1} \quad (9)$$

In equation (9), $r_j$ is the jth received code value.

As can be seen from equation (9), the received word may include n pieces of information $r_j$, where j=0, 1, ..., n−1. Each piece of information may take one unit of length, such as one bit of data, in the received word. More particularly, the received word can be expressed as:

$$r=(r_0, r_1, r_2, \ldots, r_{n-1}) \quad (10)$$

In some embodiments, r shown in equation (8) may be a binary sequence including n bits.

Figure 1D:
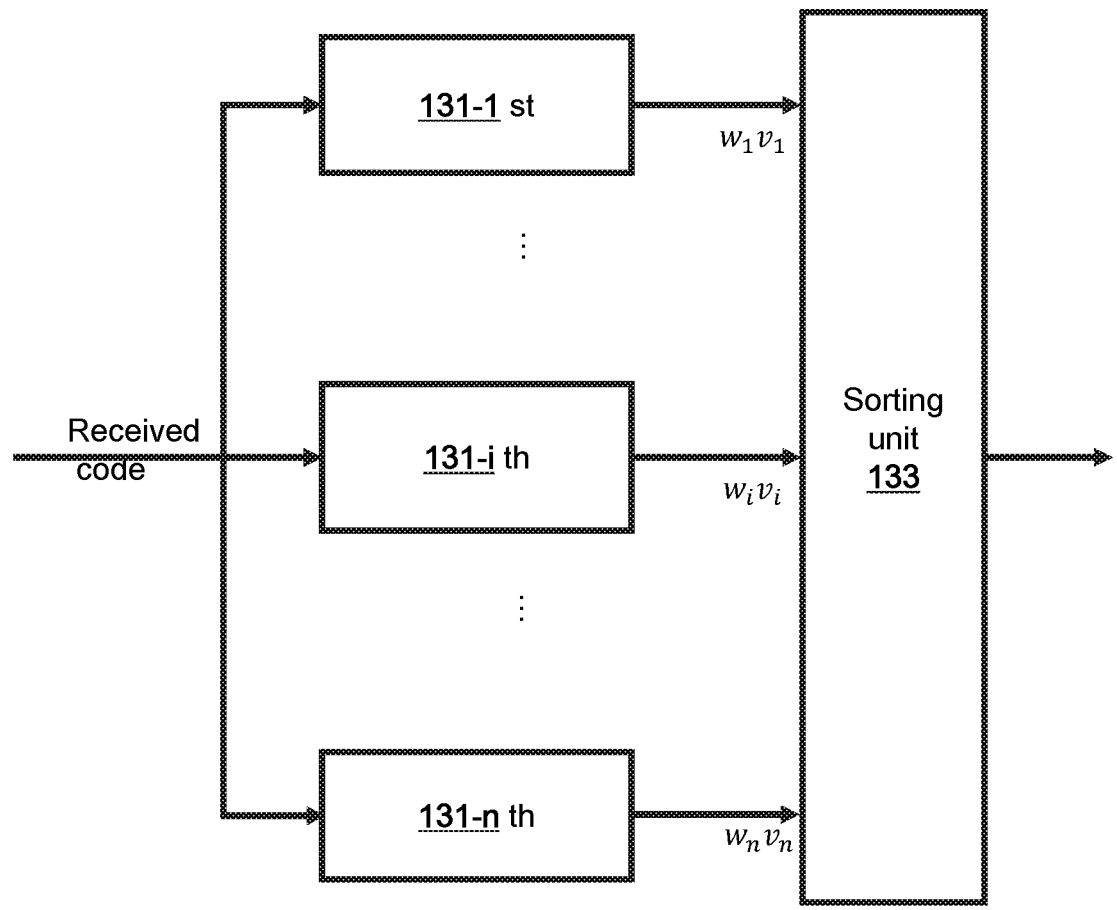
FIG. 1D illustrates a block diagram of an exemplary channel measurement circuit of the receiver according to some embodiments of the present disclosure.

Data demodulator(s) 111 may transmit the demodulated word to channel measurement circuit 113 and/or decoder 115 to obtain a decoded message. FIG. 1D illustrates a block diagram of an example of channel measurement circuit 113 in accordance with some embodiments of the present disclosure. Channel measurement circuit 113 may generate information about reliability of the demodulated word. In some embodiments, channel measurement circuit 113 may include one or more decision filters 131-1, 131-2, ..., 131-*n*, a sorting unit 133, and any other suitable component for performing channel measurement.

Each of the decision filters 131-1, 131-2, ..., and 131-*n* may generate a reliability score indicative of the reliability of a bit of the received word and/or a probability that the bit may correspond to an error. For example, each of the decision filters 131-1, 131-2, ..., and 131-*n* may generate a weighted decision vector based on a word received by channel measurement circuit 113. As another example, each of the decision filters 131-1, 131-2, . . . , and 131-*n* may generate a decision vector that may be configured to generate the weighted decision vector. More particularly, a decision vector $v_i$ may be generated by the i-th decision filter based on the following equations:

$$\text{if } v_i \geq 0, \text{ say } \hat{c}_i = r_i = 0 \quad (11)$$

$$\text{if } v_i \leq 0, \text{ say } \hat{c}_i = r_i = 1 \quad (12)$$

In equations (11) and (12), the $\hat{c}_i$ and $r_i$ may represent $i^{th}$ bit of estimated word and the received word, respectively.

Each of the decision filters 131-1, 131-2, . . . , and 131-*n* may multiply the decision vector by a weight factor $w_i$. The decision filters 131-1, 131-2, . . . , and 131-*n* may then determine measurement reliability score for each bit of the received word based on the magnitude of the output of the decision filters 131-1, 131-2, . . . , and/or 131-*n*, represented as $\delta_i = |w_i v_i|$. The reliability score may represent a bit error-probability, a channel observation, a bit reliability, or the like, or any combination thereof.

The sorting unit 133 may sort the channel measurement in ascending or descending order. For example, if the channel measurement represents the bit reliability, the sorting unit 133 may sort the bit the channel measurement in descending order for further processing.

The decoder 115 may decode the received word and may output the corrected message to the sink 117. In some embodiments, the sink 117 may include a signal processor for analyzing the received information. In some embodiments, decoder 115 may include a decoder as described below in conjunction with FIG. 2.

The system may be, for example, a cellular system, a satellite system, a point-to-point communication link, or any other suitable communication system that employs cyclic code or other error correction code. Although the example of FIG. 1A refers to a wireless communication system, the techniques described herein may be used within wire line communication systems, such as cable communication system, as well. In some embodiments, the communication system may comprise other modules which a communication system should comprise, such as one or more antennas, RF-front, Analog-to-Digital Converters (ADC), frequency converters, memory, or the like, or any combination thereof. There, RF-front, frequency converter and ADC may be configured or used to convert the received signal form the receiver 120 to the received code which may be processed in digital domain.

Figure 2:
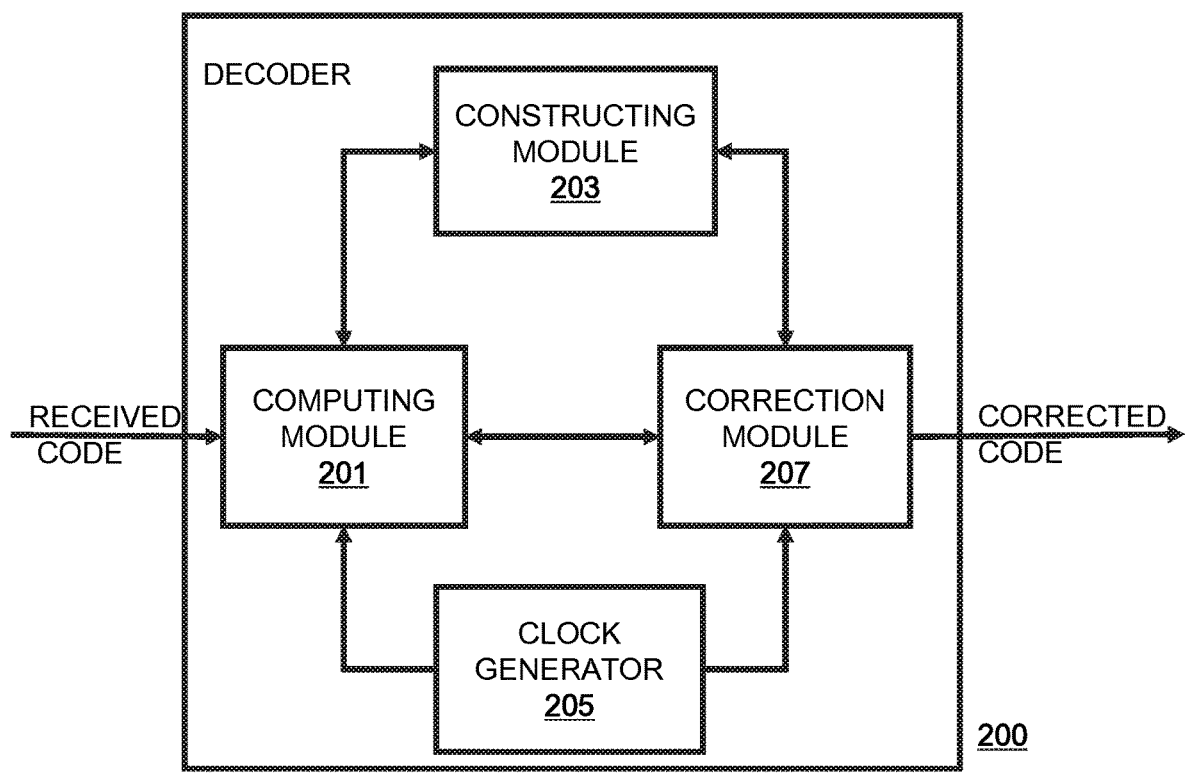
FIG. 2 illustrates a block diagram of an exemplary decoder according to some embodiments of the present disclosure.

FIG. 2 is a block diagram illustrating an example of decoder 200 in accordance with some embodiments of the present disclosure. The decoder 200 may serve as the decoder 115 shown in FIG. 1C.

As illustrated, the decoder 200 may include a computing module 201, a constructing module 203, a clock generator 205, a correction module 207, and/or any other component for decoding, error detection, error correction, and/or performing any other suitable function. As described above in conjunction with FIG. 1A-1D, the decoder 200 may be configured to decode the received word corresponding to the transmitted codeword.

Computing module 201 may be configured to compute the syndrome vector of a word and the weight of the syndrome vector. In some embodiments, the word may be the received word received from the data demodulator 111 and/or the word from the correction module 207. For example, for a (n, k, d) cyclic code, the generator matrix G may be known as follows:

$$G = [P | I_k]_{k \times n} \quad (13)$$

Wherein P is a k×(n−k) parity check matrix and $I_k$ is a k×k identity matrix. A codeword may be obtained in matrix form of c=mG.

The systematic (n−k)×n parity check matrix H may be expressed as:

$$H = [I_{n-k} | P^T]_{(n-k) \times n} \quad (14)$$

wherein $P^T$ is a (n−k)×k transpose matrix of P and $I_{n-k}$ is a (n−k)×(n−k) identity matrix.

The syndrome vector may be defined by equation (15) as following:

$$s = rH^T = r \left[ I_{n-k} \middle| \begin{array}{cccc} h_{0,n-k} & h_{0,n-k+1} & \cdots & h_{0,n-1} \\ h_{1,n-k} & h_{0,n-k+1} & \cdots & h_{0,n-1} \\ \vdots & \vdots & \ddots & \vdots \\ h_{n-k-1,n-k} & h_{n-k-1,n-k+1} & \cdots & h_{n-k-1,n-1} \end{array} \right] \quad (15)$$

Wherein $H^T$ may denote a n×(n−k) transpose matrix of H, which may be expressed as $$H^T = \left[ \frac{I_{n-k}}{P} \right]_{n \times (n-k)}.$$

s can be expressed by the following equation:

$$s = (s_0, s_1, s_2, \ldots, s_{n-k-1}) \quad (16)$$

In some embodiments, s shown in equation (16) may be a binary sequence including n−k bits.

In some embodiments, the computing module 201 may further compute the weight of the syndrome vector of the received word. The weight of the syndrome vector may be the number of logic one in the syndrome vector. For example, for a syndrome vector [1 0 0 1 1 1 0 1 0 1 1 0 1 1 0 1 0], the weight of the syndrome vector is 10.

Constructing module 203 may be configured to construct a look-up table in order to decode a cyclic code. In some embodiments, the look-up table may include syndromes vector and error patterns. For example, for a (n, k, d) cyclic code, the look-up table may include k syndromes of the k single-bit errors occurred in the message part and k error patterns in which the only one error occurs in the message part. More particularly, for a (47, 24, 11) QR code, the look-up table may include 24 syndrome vectors and 24 error patterns.

Clock generator 205 may generate and/or provide clock signals for computing module 201, constructing module 203, correction module 207, and/or any other component of the decoder 200. For example, clock generator 205 may generate system clocks and/or any other type of clock signals that may be configured to perform computing and/or error correction for cyclic codes in accordance with embodiments of the present disclosure. Clock generator 205 may include any suitable circuit that may produce clock signals. For example, clock generator 205 may be and/or include one or more oscillators, phase-locked loops (PLL), and/or any other clock generators.

Correction module 207 may be configured to correct the error occurred in the received word and generate a corrected word. In some embodiments, the correction module 207 may receive the syndrome vectors from the computing module 201 and may receive the look-up table from the constructing module 203 for correcting the received word. For example, the correction module 207 may correct the received word based on the k syndromes since the single-error patterns may be directly drawn from the syndromes.

The decoder 200 and the modules of the decoder 200 may be implemented in software, in hardware or using a combination of hardware and software elements. In some embodiments, the decoder and the modules may be implemented using general-purpose processors, which are programmed in software to carry out the functions described herein. The software may be downloaded to the processors in electronic form, over a wired or wireless network. It may, alternatively or additionally, be provided and/or stored on tangible media, such as magnetic, optical, or electronic memory.

Figure 3:
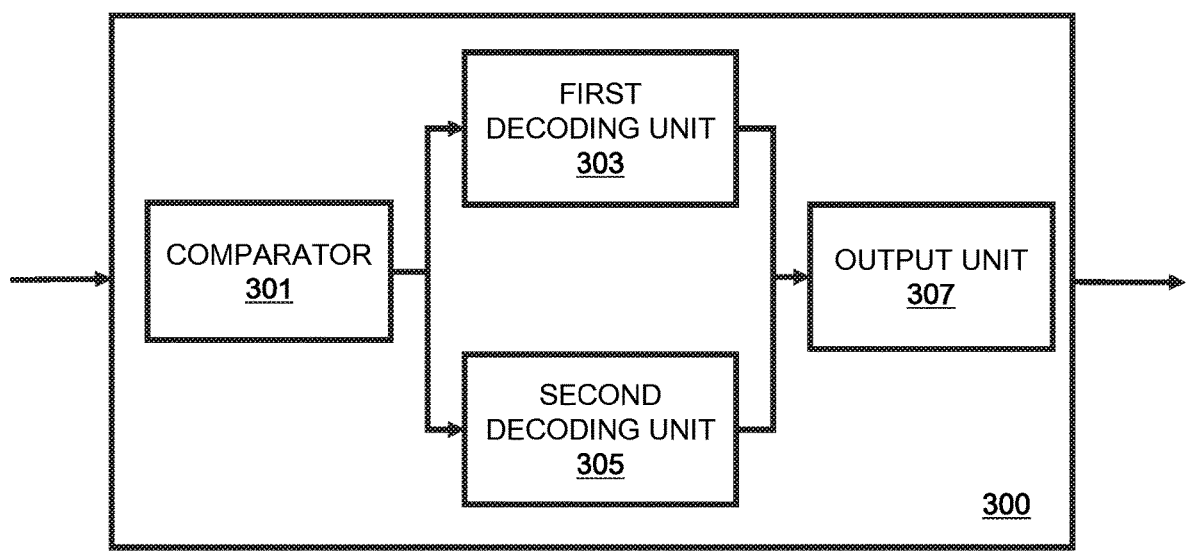
FIG. 3 illustrates a block diagram of an exemplary correction module according to some embodiments of the disclosure.

FIG. 3 illustrates a block diagram of a correction module 300 in accordance with some embodiments of the disclosure. The correction module 300 may serve as the correction module 207 shown in FIG. 2.

As illustrated, the correction module 300 may include a comparator 301, a first decoding unit 303, a second decoding unit 305, an output unit 307, and/or any other component for performing error correction. As described above in conjunction with FIG. 2, the correction module 300 may be configured to correct the error occurred in the received word. The correction module 300 may receive the received word, the weight of syndrome vector of the received word and/or the syndromes from the look-up table.

Comparator 301 may be configured to compare the weight of syndrome vector with a first threshold such as the error-correcting capacity. In some embodiments, the correction module 300 may correct the error of the received word using different ways based on the comparison. For example, the correction module 300 may using a first decoding method to correct and decoding the received word in response to the comparison that the weight of the syndrome vector is less than or equal to the error-correcting capacity. Alternatively, the correction module 300 may using a second decoding method to correct and decoding the received word in response to the comparison that the weight of the syndrome vector is larger than the error-correcting capacity.

First decoding unit 303 may be configured to decode the received word using the first decoding method. In some embodiments, the first decoding unit 303 may be configured to correct the received word when all errors are occurred in parity check section of the received word.

Second decoding unit 305 may be configured to decode the received word using the second decoding method. In some embodiments, the second decoding unit 305 may be configured to correct the received word when at least part of the errors are occurred in message section of the received word.

Output unit 307 may be configured to output the corrected word or disclosure a failure. In some embodiments, the output unit 307 may output the corrected word in response to that the received word have been decoded successfully using the first decoding unit 303 and/or the second decoding unit 305. Otherwise, the output unit 307 may disclose a decoding failure in response to the received word has not been decoded successfully.

The correction module 300 and the function units of the correction module 300 may be implemented in software, in hardware or using a combination of hardware and software elements. In some embodiments, the correction module 300 and the function units may be implemented using general-purpose processors, which are programmed in software to carry out the functions described herein. The software may be downloaded to the processors in electronic form, over a wired or wireless network. It may, alternatively or additionally, be provided and/or stored on tangible media, such as magnetic, optical, or electronic memory.

Figure 4:
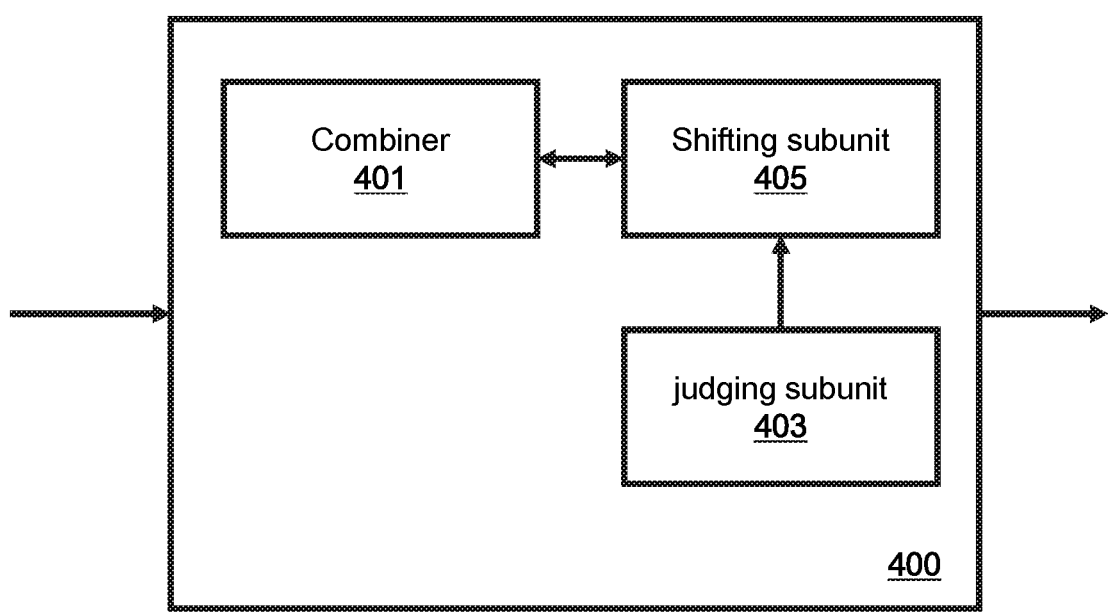
FIG. 4 illustrates a block diagram of an exemplary first decoding unit according to some embodiments of the present disclosure.

FIG. 4 illustrates a block diagram of the first decoding unit 400 in accordance with some embodiments of the present disclosure. The first decoding unit 400 may serve as the first decoding unit 303 shown in FIG. 3. As shown in the FIG. 4, the first decoding unit 400 may include a combiner 401, a judging subunit 403, a shifting subunit 405, and/or any other component for performing decoding and error correction.

The combiner 401 may be configured to generate an intermediate word for further decoding. In some embodiments, the combiner 401 may receive the received word and the syndrome vector of the received word, and then combine the received word and the syndrome vector. For example, the combiner 401 may generate the intermediate code $I_c$ based on the equation:

$$I_c = r + s \quad (17)$$

Wherein r is the received word, s is the syndrome vector of the received word and is padded zero in locations according to the message section of the received word.

The judging subunit 403 may be configured to judge whether the received word has been shifted. In some embodiment, the received word may be shifted to the left by k bits if the received word does not be decoded successfully.

The shifting subunit 405 may be configured to generate decoded word $d_c$ based on the intermediate word $I_c$ and the judgement from the judging subunit 403. In some embodiments, the shifting subunit 405 may be configured to shift the intermediate word to left and/or right by some bits to obtain the decoded word $d_c$. For example, if the received word has been shifted to the left by k bits, the shifting subunit 405 may determine the decoded word $d_c$ according to the following equation:

$$d_c = I_c >> k \quad (18)$$

Wherein $d_c$ may indicate that the intermediate word $I_c$ is shifted to the right by k bit.

In some embodiments, the shifting subunit 405 may output the decoded word $d_c$ to other component of correction module 207 and/or decoder 115 for further processing, for example, reading and/or analyzing information of the received signal.

The first decoding unit 400 and the function units of first decoding unit 400 may be implemented in software, in hardware or using a combination of hardware and software elements. In some embodiments, the correction module 300 and the function units may be implemented using general-purpose processors, which are programmed in software to carry out the functions described herein. The software may be downloaded to the processors in electronic form, over a wired or wireless network. It may, alternatively or additionally, be provided and/or stored on tangible media, such as magnetic, optical, or electronic memory.

Figure 5:
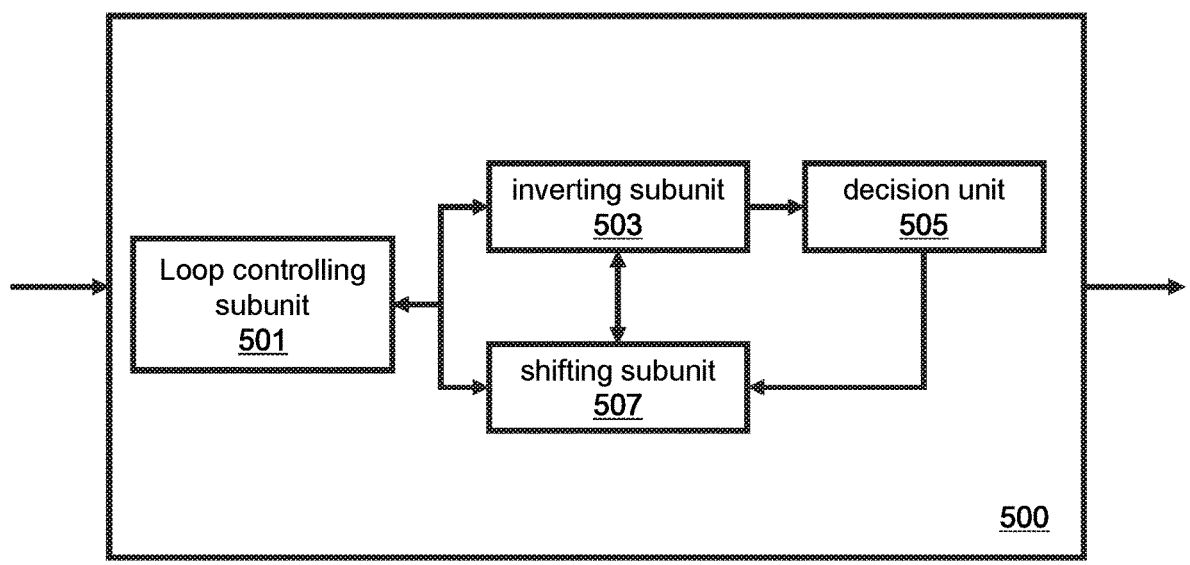
FIG. 5 illustrates a block diagram of an exemplary second decoding unit according to some embodiments of the present disclosure.

FIG. 5 illustrates a block diagram of the second decoding unit 500 in accordance with some embodiments of the present disclosure. The second decoding unit 500 may serve as the second decoding unit 305 shown in FIG. 3. As shown in FIG. 5, the second decoding unit 500 may include a loop controlling subunit 501, an inverting subunit 503, a decision subunit 505, a shifting subunit 507, and/or any other component for performing decoding and error correction.

Loop controlling subunit 501 may be configured to control a loop condition which may determine processing method of the received word. In some embodiments, the loop controlling subunit 501 may be configured to assume a value $w_e$, which may mean that the message section of the received word have $w_e$ errors. For example, the initial value $w_e$ may be 1 and there is one error occurred in the message section. In some embodiments, the loop condition may be that $w_e \leq \lfloor t/2 \rfloor$, wherein $\lfloor t/2 \rfloor$ indicates the largest integer smaller than or equal to $t/2$. In some embodiments, the loop controlling subunit 501 may include an adder in order to add 1 to $w_e$.

The inverting subunit 503 may be configured to invert one or more bits in the message section of the received word. In some embodiments, the inverting subunit 503 may invert $w_e$ bits in the message section of the received word. For example, if $w_e=2$ and $w_e \leq \lfloor t/2 \rfloor$, the inverting subunit 503 may invert 2 bits in order of descending reliability obtained by the channel measurement circuit 113. As another example, the inverting subunit 503 may invert 2 bits in sequence. In some embodiments, the inverting subunit 503 may receive the shifted received word from the shifting subunit 507 and then invert the shifted received word according to the method mentioned previously. In some embodiments, the syndrome vector of inverted received word can be expressed by $s_{invert} = s + \Sigma_{i=0}^{w_e-1} s_{m,l_i}$, wherein $s_{m,l_i}$, $0 \leq i \leq w_e - 1$, is the syndrome vector of error pattern in which only one error occurs in the message part. The error location in the word is the location of the inverted bit $l_i$. The $s_{m,l_i}$ can be received from the look-up table constructed in the constructing module 203.

The decision subunit 505 may be configured to determine whether the weight of the syndrome vector of the inverted received word is smaller than or equal to $t-w_e$, as $w(s_{invert}) \leq t-w_e$ or not. In some embodiments, the decision subunit 505 may obtain an intermediate word $I_c$ in response to that $w(s_{invert}) \leq t-w_e$. The intermediate word $I_c$ can be expressed in following equation:

$$I_c = r + \Sigma_{i=0}^{w_e-1} e_{m,l_i} + s_{invert} \qquad (19)$$

Wherein the $l_i$ is the location of the inverted bit.

The decision subunit 505 may transmit the intermediate word $I_c$ to the shifting subunit 507 for further processing in order to obtain corrected word.

The shifting subunit 507 may be configured to cyclically shift the received word to the left and/or right by k bits and/or generate decoded word $d_c$ based on the intermediate word $I_c$. In some embodiments, the shifting subunit 507 may determine the decoded word $d_c$ based on the equation (18) when the received word may be shifted to the left by k bits. And then the shifting uniting 507 may output the decoded word $d_c$ to other component of correction module 207 and/or decoder 115 for further processing, for example, reading and/or analyzing information of the received signal.

In some embodiments, the shifting subunit 507 may cyclically shift the received word to the left by k bits and then transmit the shifted received word to computing module 201.

The second decoding unit 500 and the function units of second decoding unit 500 may be implemented in software, in hardware or using a combination of hardware and software elements. In some embodiments, the second decoding unit 500 and the function units may be implemented using general-purpose processors, which are programmed in software to carry out the functions described herein. The software may be downloaded to the processors in electronic form, over a wired or wireless network. It may, alternatively or additionally, be provided and/or stored on tangible media, such as magnetic, optical, or electronic memory.

Figure 6:
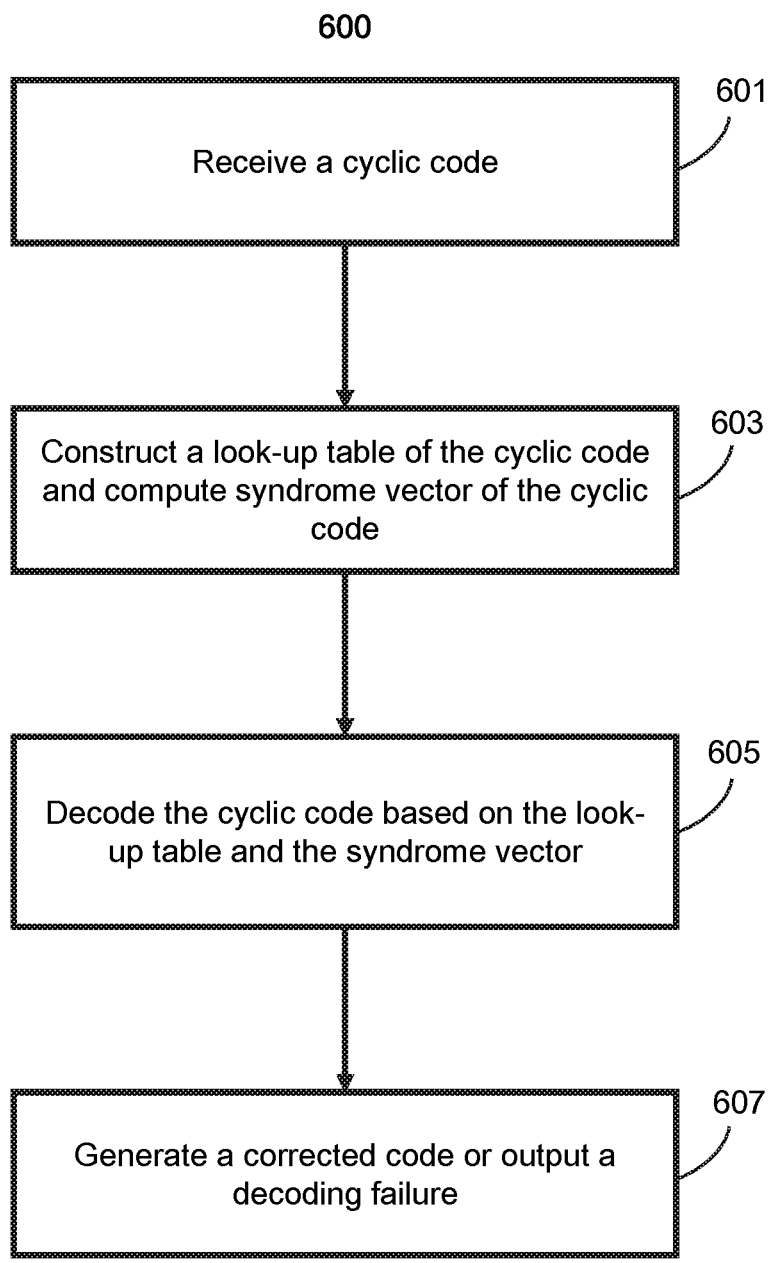
FIG. 6 illustrates a flow chart of an exemplary process for decoding a cyclic code according to some embodiments of the present disclosure.

FIG. 6 illustrates a flow chart of a process 600 for decoding a cyclic code according to some embodiments of the present disclosure. In some embodiments, the process 600 may be executed using one or more hardware processors implementing a decoder as described above in connection with FIG. 1-5.

The decoder may receive a word (referred as "received word") at block 601. The received word may be obtained by a codeword of (n, k, d) cyclic code transmitted through a channel, for example, a wireless channel, a wired channel, a Rayleigh fading channel, a Rice fading channel, a Gaussian channel, a noisy channel, or the like, or any combination thereof.

At 603, the decoder may construct a look-up table for the (n, k, d) cyclic code and compute a syndrome vector of the received word. In some embodiments, the look-up table may include some syndromes and corresponding error patterns. More particularly, the look-up table may include k syndromes of the k single-bit errors occurred in the message section and k error patterns, wherein each error patterns contains single information bit error. In some embodiments, the syndrome vector of the received word may be calculated based on equations (14)-(16).

At 605, the decoder may decode the received word based on the look-up table and the syndrome vector. For example, the decoder may shift the received word into left or right by some bits based on the weight of the syndrome vector of the received word. The decoder may then find an error pattern from the look-up table directly based on the weight of syndrome vector of the shifted received word. In some embodiments, the decoder may select a decoding method based on the syndrome vector for further processing.

At 607, the decoder may generate a corrected word in response to that the received word has been decoded successfully and/or output a decoding failure. In some embodiments, the corrected word and/or the decoding failure may be generated and/or output using the output unit 307 as described above in connection with FIG. 3.

Figure 7:
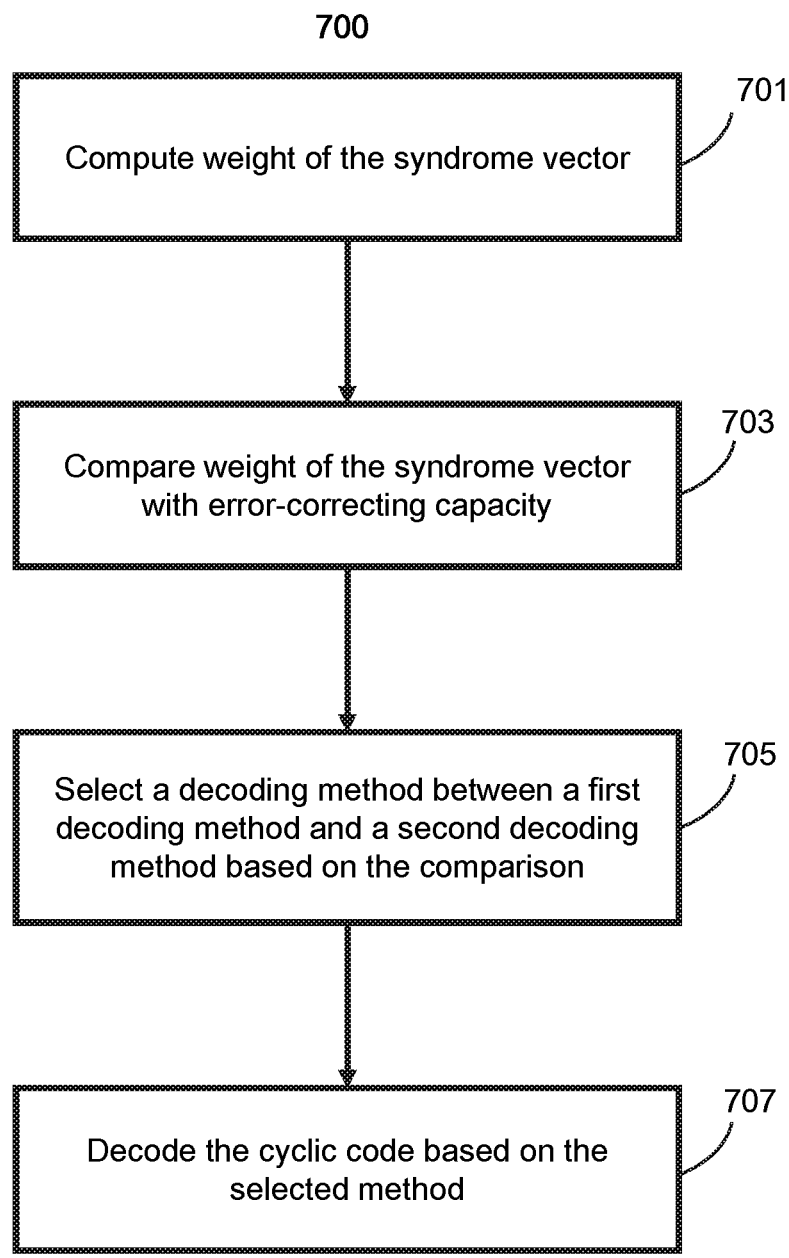
FIG. 7 illustrates a flow chart of an exemplary process for selecting different decoding methods for decoding a cyclic code according to some embodiments of the present disclosure.

FIG. 7 illustrates a flow chart of a process 700 for selecting different decoding methods for decoding the received word according to some embodiments of the present disclosure. In some embodiments, the process 700 may be executed using one or more hardware processors implementing a decoder as described above in connection with FIG. 1-5.

The decoder may compute a weight of the syndrome vector at block 701. The weight of the syndrome vector may be the number of logic one in the syndrome vector. For example, for a syndrome vector [1 0 0 1 1 1 0 1 0 1 1 0 1 1 0 1 0], the weight of the syndrome vector is 10. In some embodiments, the syndrome vector may be obtained by performing one or more operations described above in connection with block 603 of FIG. 6.

At 703, the decoder may compare the weight of the syndrome vector with error-correcting capacity of the cyclic code. For a (n, k, d) QR code, the error-correcting capacity may be computed as $\lfloor (d-1)/2 \rfloor$, wherein $\lfloor x \rfloor$ denotes the greatest integer less than or equal to x. More particularly, for a (71, 36, 11) QR code, the error-correcting capacity may be 5.

At 705, the decoder may select a decoding method between a first decoding method and a second decoding method based on the comparison. In some embodiments, the decoder may decode the received word using the first decoding method in response to that the weight of the syndrome vector is smaller than or equal to the error-correcting capacity. Alternatively, the decoder may decode the received word using the second decoding method in response to that the weight of the syndrome vector is larger than the error-correcting capacity.

At 707, the decoder may decode the received word based on the selected decoding method.

Figure 8:
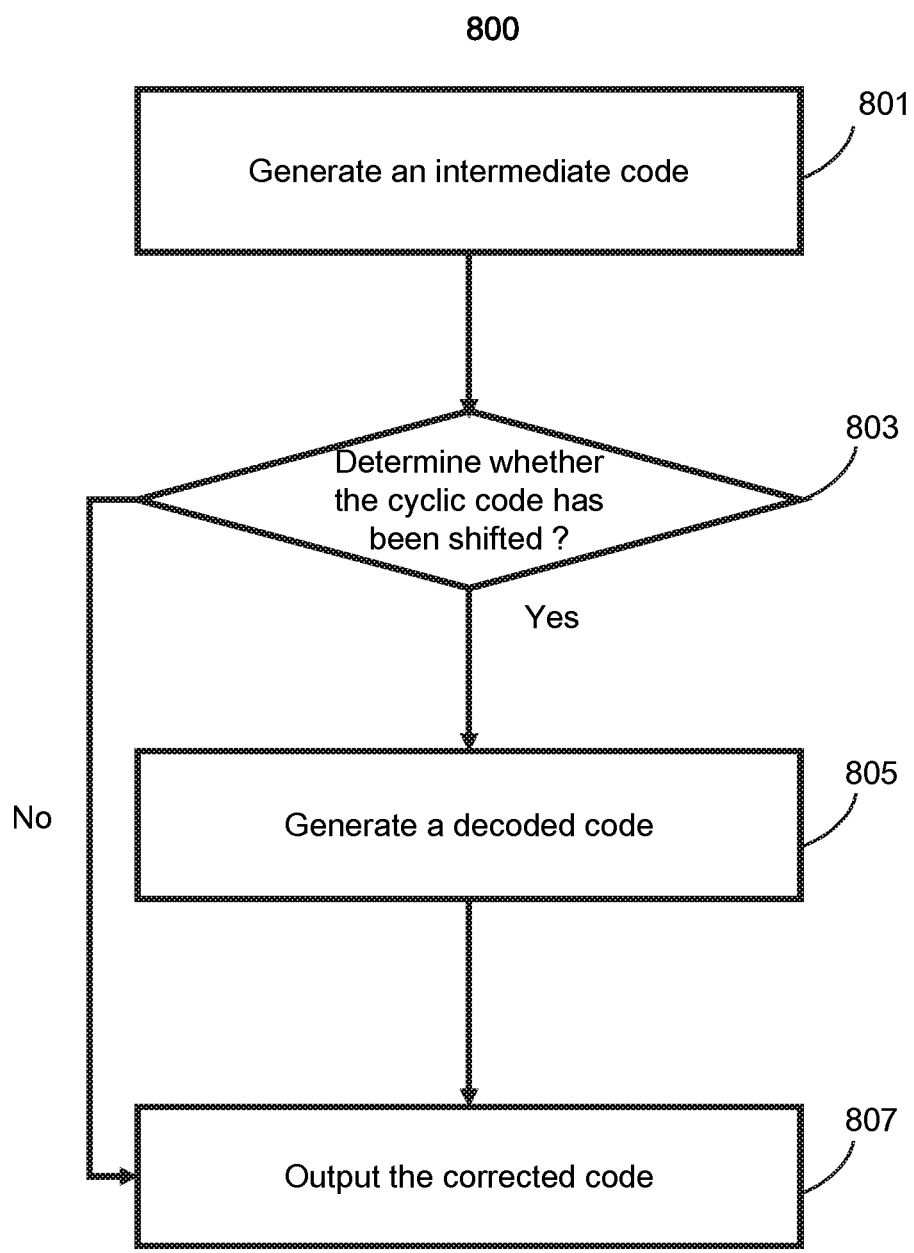
FIG. 8 illustrates a flow chart of an exemplary process for a first method for decoding a cyclic code according to some embodiments of the present disclosure.

FIG. 8 illustrates a flow chart of a process 800 for a first method for decoding a cyclic code according to some embodiments of the present disclosure. In some embodiments, the process 800 may be executed using one or more hardware processors implementing a decoder as described above in connection with FIG. 1-5.

As illustrated, the decoder may generate an intermediate word at block 801. In some embodiments, the decoder may receive the received word and the syndrome vector of the received word, and then combine the received word and the syndrome vector in order to generate the intermediate word. For example, the intermediate word can be expressed in equation (17).

At 803, the decoder may determine whether the received word has been shifted. In some embodiments, the process 800 may advance to 805 in response to that the received word has been decoded. Alternatively, the process 800 may advance to 807 in response to that the received word has not been decoded.

At 805, the decoder may generate a decoded word. In some embodiments, the decoder may generate the decoded word by shifting the intermediate word to right by k bits. For example, the decoded word can be expressed in equation (18).

At 807, the decoder may output the decoded word. In some embodiments, the decoded word may be the intermediate word. In some embodiments, the block 807 may be executed by output unit 307 described above in the FIG. 3.

Figure 9A:
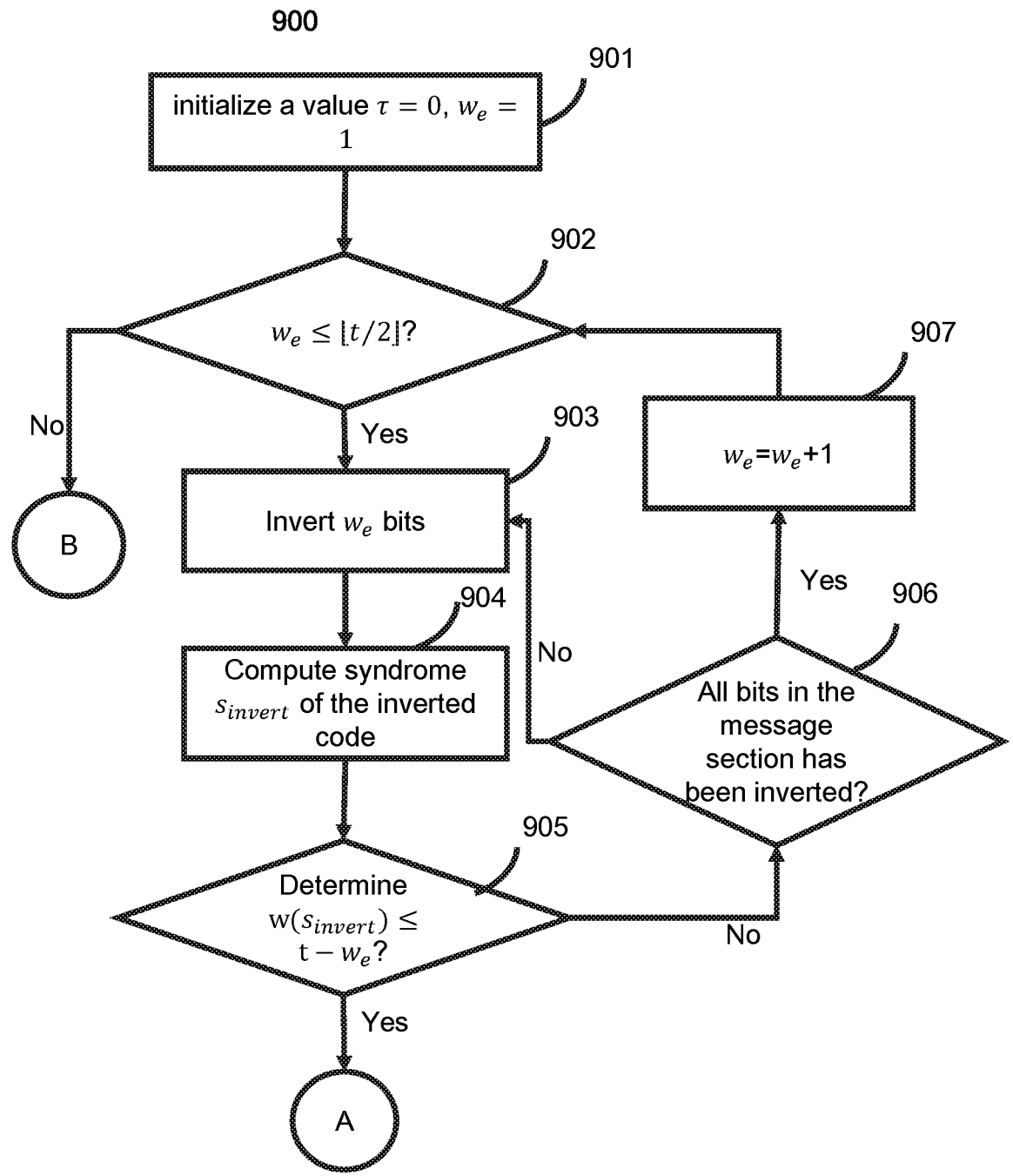
FIG. 9A-9C illustrates a flow chart of an exemplary process for a second method for decoding a cyclic code according to some embodiments of the present disclosure.
Figure 9B:
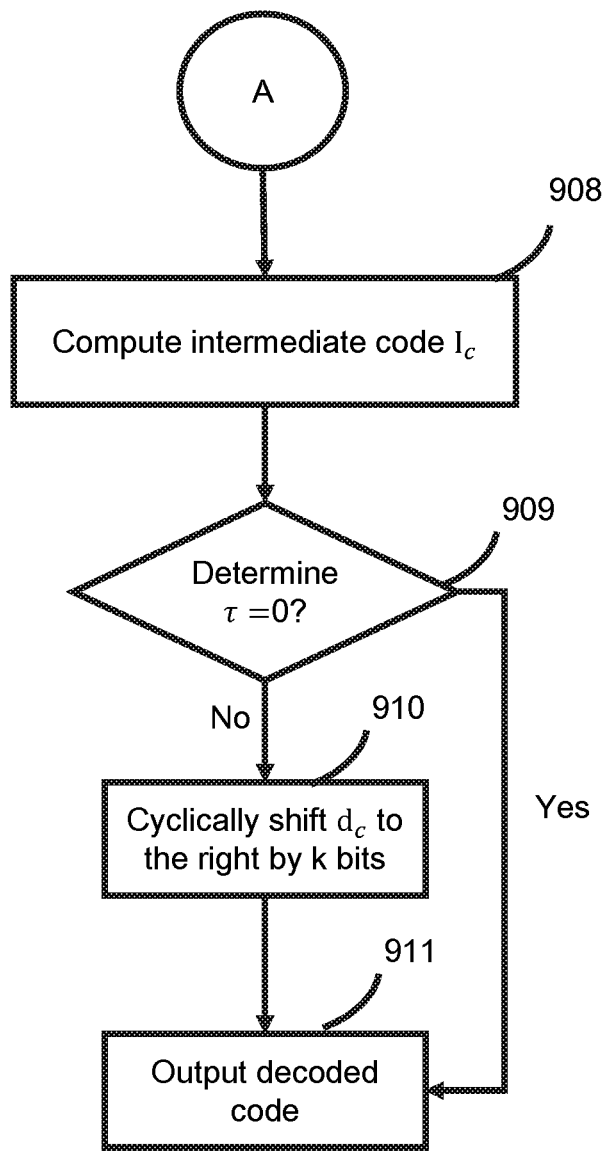
Figure 9C:
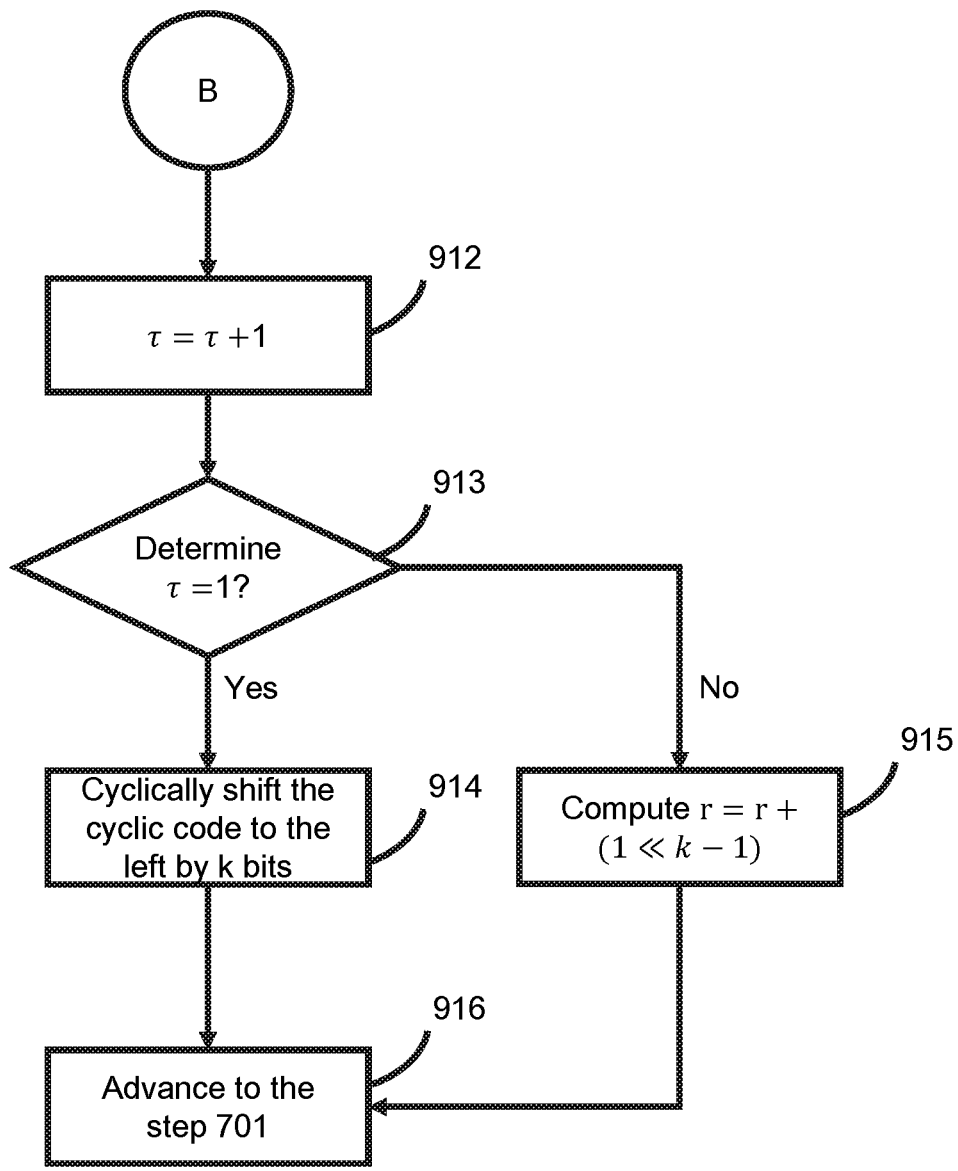

FIG. 9A-FIG. 9C illustrates a flow chart of a process 900 for a second method for decoding a cyclic code according to some embodiments of the present disclosure. In some embodiments, the process 900 may be executed using one or more hardware processors implementing a decoder as described above in connection with FIG. 1-5.

As illustrated, the decoder may initialize a value $\tau=0$ and $w_e=1$ at block 901. In some embodiments, $\tau$ is constant and may indicate whether the received word has been cyclically shifted or not. In some embodiments, $w_e$ may indicate that there are $w_e$ errors occurred in the message section of the received word.

At 902, the decoder may determine whether $w_e$ is not larger than $\lfloor t/2 \rfloor$, wherein t is the error-correcting capacity. In some embodiments, the flow chart may advance to 903 when $w_e$ is not larger than $\lfloor t/2 \rfloor$. Alternatively, the flow chart may advance to 912 shown in FIG. 9C when $w_e$ is larger than $\lfloor t/2 \rfloor$.

At 903, the decoder may invert $w_e$ bits repeatedly. In some embodiments, the decoder may invert $w_e$ bits in the message section of the received word in order to obtain an inverted received word. For example, the decoder may invert the bits in order of descending reliability according to the method mentioned previously. As another example, the decoder may invert the bits in the message section of the cyclic code in sequence.

At 904, the decoder may compute the syndrome vector $s_{invert}$ of the inverted received word. The syndrome vector $s_{invert}$ can be computed based on the equation $s_{invert}=s+\sum_{i=0}^{w_e-1} s_{m,l_i}$, wherein $s_{m,l_i}$, $0 \le i \le w_e-1$, is the syndrome vector of error pattern in which only one error occurs in the message section, wherein the location of error occurred in the message section of the received word is the location of the inverted bit $l_i$. The $s_{m,l_i}$ can be received from the look-up table constructed in the constructing module 203. Furthermore, the decoder may compute the weight $w(s_{invert})$ of the syndrome of the inverted received word.

At 905, the decoder may determine whether $w(s_{invert})$ is not larger than $t-w_e$. In some embodiments, the flow chart may advance to 906 when $w(s_{invert})$ is larger than $t-w_e$. Alternatively, the flow chart may advance to 908 shown in FIG. 9B when $w_e$ is not larger than $\lfloor t/2 \rfloor$.

At 906, the decoder may determine that all bits in the message section of the received word has been inverted. In some embodiments, the flow chart may proceed to 903 when not all bits in the message section has been inverted. Alternatively, the flow chart may proceed to 907 when all bits in the message section has been inverted.

At 907, the decoder may perform the computation $w_e=w_e+1$, and then the flow chart may proceed to 902.

At 908, the decoder may compute an intermediate word $I_c$. In some embodiments, the intermediate word $I_c$ can be expressed in equation (19).

At 909, the decoder may determine whether T is equal to zero. In some embodiments, the flow chart may proceed to 910 when r is not equal to zero. Alternatively, the flow chart may proceed to 911 when r is equal to zero.

At 910, the decoder may cyclically shift the decoded word $d_c$ to the right by k bits for obtain a final decoded word.

At 911, the decoder may output the decoded word. In some embodiments, the decoder may output the intermediate word $I_c$ as the decoded word. In some embodiments, the decoder may output the final decoded word when $\tau$ is equal to zero.

At 912, the decoder may perform the computation $\tau=\tau+1$, and then the flow chart may proceed to 915.

At 913, the decoder may determine whether $\tau$ is equal to 1. In some embodiments, the flow chart may proceed to 915 when $\tau$ is not equal to 1. Alternatively, the flow chart may proceed to 914 when $\tau$ is equal to 1.

At 914, the decoder may cyclically shift the received word to the left by k bits.

At 915, the decoder may compute the received word r using the equation $r=r+(1<<k-1)$. In some embodiments, the received word may be updated by inverting the $(k-1)^{th}$ bit of the cyclic code.

At 916, the flow chart may advance to the step 701. The decoder may perform the above described operation again.

It should be noted that the above description is merely provided for the purposes of illustration, and not intended to limit the scope of the present disclosure. For persons having ordinary skills in the art, multiple variations or modifications may be made under the teachings of the present disclosure. However, those variations and modifications do not depart from the scope of the present disclosure. For example, 914 and 915 may be combined as a single step for generating a decoded word.

The above described steps of the processes of FIGS. 6-9 can be executed or performed in any order or sequence not limited to the order and sequence shown and described in the figures. Also, some of the above steps of the processes of FIGS. 6-9 can be executed or performed substantially simultaneously where appropriate or in parallel to reduce latency and processing times.

Although the invention has been described and illustrated in the foregoing illustrative implementations, it is understood that the present disclosure has been made only by way of example, and that numerous changes in the details of implementation of the invention can be made without departing from the spirit and scope of the invention, which is limited only by the claims that follow. Features of the disclosed implementations can be combined and rearranged in various ways.

What is claimed is:

1. A system, comprising:
   at least one storage medium including a set of instructions for decoding a (n, k, d) cyclic code, which including a message section and a parity check section, wherein d is a Hamming distance of the cyclic code;
   at least one processor configured to communicate with the at least one storage medium, wherein when executing the set of instructions, the at least one processor is directed to:
   receive a word corresponding to the (n, k, d) cyclic code;
   obtain a look-up table, wherein the look-up table includes k syndrome vectors and k error patterns;
   compute a syndrome vector of the received word;
   determine a weight of the syndrome vector of the received word;
   determine whether the weight of the syndrome vector of the received word is more than an error-correcting capacity;
   decode the cyclic code by adding the received word and the syndrome vector when the weight of the syndrome vector of the received word is not more than error-correcting capacity; and
   decode the received word by inverting bits in the message section in sequence and re-computing a syndrome vector of the inverted received word when the weight of the syndrome vector of the received word is more than the error-correcting capacity.

2. The system of claim 1, wherein the (n, k, d) cyclic code is a Quadratic Residue code.

3. The system of claim 1, wherein each of the k syndrome vectors has a single-bit error occurred in the message section and the k error patterns are error patterns in which only one error occurs in the message section.

4. The system of claim 1, wherein the error-correcting capacity is equal to $[(d-1)/2]$, wherein $[(d-1)/2]$ denotes the greatest integer not more than $(d-1)/2$.

5. The system of claim 1, wherein the at least one processor is further directed to pad the syndrome vector of the received word with zeros in locations according to the message section of the received word.

6. The system of claim 5, wherein when the weight of the syndrome vector of the received word is not more than the error-correcting capacity, the at least one processor is further directed to:
   generate a decoded word;
   determine whether the received word has been shifted to left by k bits;
   shift the decoded word to right by k bits when the received word has been shifted to left by k bits; and
   output the decoded word.

7. The system of claim 1, when the weight of the syndrome vector of the received word is more than the error-correcting capacity, the at least one processor is further directed to:
   determine a weight of the syndrome vector of the inverted received word;
   compare the weight of the syndrome vector of the inverted received word with a difference between the error-correcting capacity with the number of the inverted bits;
   generate a decoded word according to $I_c = r + \Sigma_{i=0}^{w_e-1} e_{m,l_i} + s_{invert}$, wherein r is the received word, $w_e$ is number of errors occurred in the message section of the received word, $e_{m,l_i}$ is an error pattern, an error location of which is the location of the inverted bit, $s_{invert}$ is the syndrome vector of the inverted received word and padding zeros in locations according to the message section of the inverted received word, and the syndrome vector $s_{invert}$ is determined based on a syndrome vector of an error pattern retrieved from the look-up table.

8. The system of claim 7, wherein the at least one processor is further directed to:
   determine whether the received word is cyclically shifted to the left by k bits;
   shift cyclically the decoded word to the right by k bits when the received word is cyclically shifted to the left by k bits; and
   output the decoded word.

9. The system of claim 7, wherein the at least one processor is further directed to:
   shift the received word to the left by k bits cyclically if number of errors occurred in the message section of the received word is more than $[t/2]$, wherein the t is the error-correcting capacity;
   re-compute syndrome vector of the cyclically shifted received word; and
   decode the cyclically shifted received word iteratively.

10. The system of claim 9, wherein the at least one processor is further directed to:
    determine whether the cyclically shifted received word is decoded successfully;
    invert the $(k-1)^{th}$ bit of the cyclically shifted received word to update the cyclically shifted received word; and
    decode the cyclically shifted received word iteratively.

11. A method for decoding a (n, K d) cyclic code including a message section and a parity check section, comprising:
    receiving a word corresponding to the (n, k, d) cyclic code, wherein d is a Hamming distance of the cyclic code;
    obtaining a look-up table, wherein the look-up table includes k syndrome vectors and k error patterns;
    computing a syndrome vector of the received word;
    determining a weight of the syndrome vector of the received word;
    determining whether the weight of the syndrome vector of the received word is more than an error-correcting capacity;
    decoding, using a processor, the received word by adding the received word and the syndrome vector when the weight of the syndrome vector of the received word is not more than the error-correcting capacity; and
    decoding, using a processor, the received word by inverting bits in the message section in sequence and re-computing a syndrome vector of the inverted received word when the weight of the syndrome vector of the received word is more than the error-correcting capacity.

12. The method of claim 11, wherein the (n, k, d) cyclic code is a Quadratic Residue code.

13. The method of claim 11, wherein each of the k syndrome vectors has a single-bit error occurred in the message section and the k error patterns are error patterns in which only one error occurs in the message section.

14. The method of claim 11, wherein the error-correcting capacity is equal to $[(d-1)/2]$, wherein $[(d-1)/2]$ denotes the greatest integer not more than $(d-1)/2$.

15. The method of claim 11, further comprising padding the syndrome vector of the received word with zeros in locations according to the message section of the received word.

16. The method of claim 15, wherein decoding the received word by adding the received word and the syndrome vector further comprises:
generating a decoded word;
determining whether the received word has been shifted to left by k bits;
shifting the decoded word to right by k bits when the received word has been shifted to left by k bits; and
outputting the decoded word.

17. The method of claim 11, wherein decoding the received word by inverting bits in the message section in sequence and re-computing the syndrome vector of the inverted received word further comprises:
determining a weight of the syndrome vector of the inverted received word;
comparing the weight of the syndrome vector of the inverted received word with a difference between the error-correcting capacity with the number of the inverted bits;
generating a decoded word according to $I_c = r + \sum_{i=0}^{w_e-1} e_{m,I_i} + s_{invert}$, wherein r is the received word, $w_e$ is number of errors occurred in the message section of the received word, $e_{m,I_i}$ is an error pattern, an error location of which is the location of the inverted bit, $s_{invert}$ is the syndrome vector of the inverted received word and padded zeros in locations according to the message section of the inverted received word, and the syndrome vector $s_{invert}$ is determined based on a syndrome vector of an error pattern retrieved from the look-up table.

18. The method of claim 17, further comprising:
determining whether the received word is cyclically shifted to the left by k bits;
shifting cyclically the decoded word to the right by k bits when the received word is cyclically shifted to the left by k bits; and
outputting the decoded word.

19. The method of claim 17, further comprising:
shifting the received word to the left by k bits cyclically if number of errors occurred in the message section of the received word is more than [t/2], wherein the I is the error-correcting capacity;
re-computing syndrome vector of the cyclically shifted received word; and
decoding the cyclically shifted received word iteratively.

20. The method of claim 19, further comprising:
determining whether the cyclically shifted received word is decoded successfully;
inverting the $(k-1)^{th}$ bit of the cyclically shifted received word to update the cyclically shifted received word; and
decoding the cyclically shifted received word iteratively.

* * * * *